(12) United States Patent
Chang

(10) Patent No.: US 9,343,633 B1
(45) Date of Patent: May 17, 2016

(54) LIGHT-EMITTING DIODE LIGHTING DEVICE

(71) Applicant: MIKRO MESA TECHNOLOGY CO., LTD., Apia (WS)

(72) Inventor: Pei-Yu Chang, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 39 days.

(21) Appl. No.: 14/529,162

(22) Filed: Oct. 31, 2014

(51) Int. Cl.
| | |
|---|---|
| H01L 33/48 | (2010.01) |
| H01L 27/15 | (2006.01) |
| H01L 33/40 | (2010.01) |
| H01L 33/42 | (2010.01) |
| H01L 33/50 | (2010.01) |
| H01L 33/58 | (2010.01) |

(52) U.S. Cl.
CPC .............. *H01L 33/483* (2013.01); *H01L 27/15* (2013.01); *H01L 33/405* (2013.01); *H01L 33/42* (2013.01); *H01L 33/502* (2013.01); *H01L 33/58* (2013.01)

(58) Field of Classification Search
None
See application file for complete search history.

(56) References Cited

U.S. PATENT DOCUMENTS

| | | | |
|---|---|---|---|
| 6,992,334 B1 * | 1/2006 | Wierer, Jr. ............. | H01L 33/405 257/745 |
| 8,076,680 B2 | 12/2011 | Lee et al. | |
| 8,192,051 B2 | 6/2012 | Dau et al. | |
| 8,338,199 B2 | 12/2012 | Lerman et al. | |
| 8,338,840 B2 | 12/2012 | Lerman et al. | |
| 8,338,841 B2 | 12/2012 | Lerman et al. | |
| 8,502,239 B2 * | 8/2013 | Liu ..................... | H01L 25/0753 257/88 |
| 2006/0017372 A1 * | 1/2006 | Chu ........................ | H01L 33/38 313/498 |
| 2008/0179602 A1 * | 7/2008 | Negley ................ | H01L 21/2654 257/88 |
| 2008/0230789 A1 | 9/2008 | Onushkin et al. | |
| 2010/0109026 A1 | 5/2010 | Onushkin et al. | |
| 2010/0237381 A1 * | 9/2010 | Kamiya .................. | H01L 33/42 257/99 |
| 2010/0291374 A1 * | 11/2010 | Akarsu ................... | B82Y 20/00 428/328 |
| 2011/0193105 A1 * | 8/2011 | Lerman ............... | H01L 25/0753 257/88 |
| 2013/0264592 A1 * | 10/2013 | Bergmann ............. | H01L 33/50 257/88 |
| 2013/0334563 A1 | 12/2013 | Lei et al. | |
| 2014/0003041 A1 | 1/2014 | Dau et al. | |

FOREIGN PATENT DOCUMENTS

| | | |
|---|---|---|
| CN | 102132429 A | 7/2011 |
| CN | 103531695 A | 1/2014 |
| WO | 2012057482 A2 | 5/2012 |

* cited by examiner

*Primary Examiner* — Joshua King
(74) *Attorney, Agent, or Firm* — CKC & Partners Co., Ltd.

(57) ABSTRACT

A light-emitting diode (LED) lighting device includes a substrate, a first bottom electrode, a second bottom electrode, a first bottom transparent isolation layer, a second bottom transparent isolation layer, a first vertical LED, a second vertical LED, and a top transparent electrode. The substrate has a first recess and a second recess therein. The first bottom electrode and the second bottom electrode are respectively disposed in the first recess and the second recess and are reflective. The first vertical LED is disposed in the first recess and on the first bottom electrode. The second vertical LED is disposed in the second recess and on the second bottom electrode. The first bottom transparent isolation layer and the second bottom transparent isolation layer are respectively disposed in the first recess and the second recess. The top transparent electrode electrically connects the first vertical LED and the second bottom electrode.

23 Claims, 8 Drawing Sheets

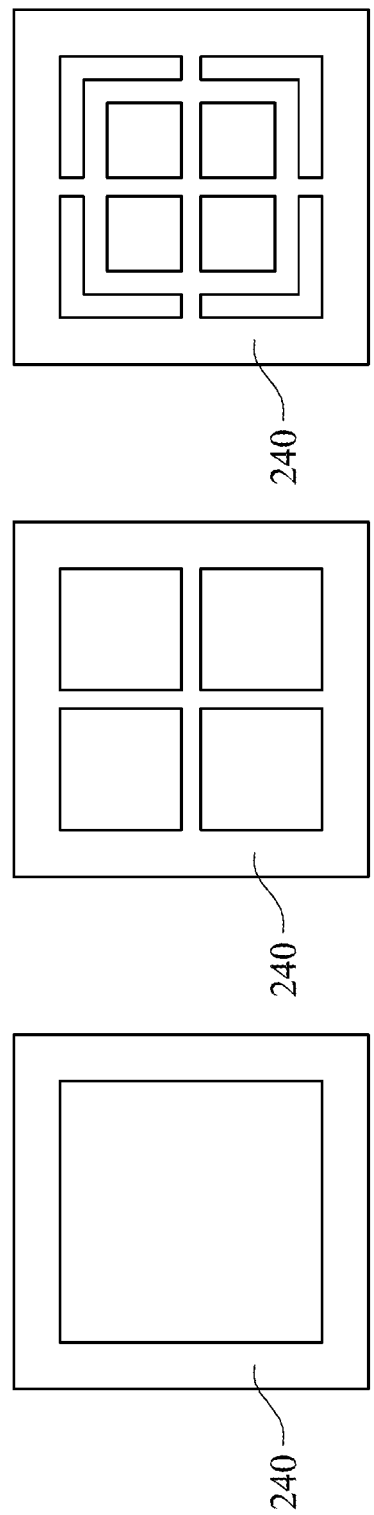

LIGHT-EMITTING DIODE LIGHTING DEVICE

BACKGROUND

In recent years, light-emitting diode (LED) technologies have improved a lot, and LEDs with high power and high brightness have been presented to the market. In addition, the LEDs used as light bulbs have the advantage of long lifetime. Therefore, such LED light bulbs have the tendency to replace other conventional light sources. LEDs can be applied to various types of lamps, such as traffic lights, street lights, and flashlights.

Since LEDs gradually become mainstream light sources, improving properties of LEDs becomes an important issue, and this becomes the main goal in the R&D departments of the LED industries.

SUMMARY

This disclosure provides a light-emitting diode (LED) lighting device to achieve high power, high luminous efficiency, and longer lifetime.

In one aspect of the disclosure, a LED lighting device is provided. The LED lighting device includes a substrate, a first bottom electrode, a second bottom electrode, a first bottom transparent isolation layer, a second bottom transparent isolation layer, at least one first vertical LED, at least one second vertical LED, and a top transparent electrode. The substrate has at least one first recess and at least one second recess therein, in which at least one of the first recess and the second recess has a bottom surface and at least one tapered side surface adjacent to the bottom surface. The first bottom electrode is disposed in the first recess. The second bottom electrode is disposed in the second recess, in which at least one of the first bottom electrode and the second bottom electrode is reflective and covers at least a part of the bottom surface and at least a part of the tapered side surface. The first vertical LED is disposed in the first recess and on the first bottom electrode. The second vertical LED is disposed in the second recess and on the second bottom electrode. The first bottom transparent isolation layer is disposed in the first recess, in which the first bottom transparent isolation layer has at least one opening therein to expose at least a part of the first vertical LED. The second bottom transparent isolation layer is disposed in the second recess, in which the second bottom transparent isolation layer has at least one opening therein to expose at least a part of the second vertical LED. The top transparent electrode electrically connects the first vertical LED and the second bottom electrode.

By electrically connecting the first vertical LED and the second vertical LED in series, the LED lighting device can achieve high power and high luminous efficiency by electrically connecting to a power supply with high voltage. In addition, the current passing the first vertical LED and the second vertical LED needs not to be large to achieve high power and high luminous efficiency. Therefore, the lifetime of the first vertical LED and the second vertical LED may be longer, and cooling may not become a problem.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 4A to 4C are horizontal cross-sectional views of a patterned dielectric layer according to different embodiments of this disclosure;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
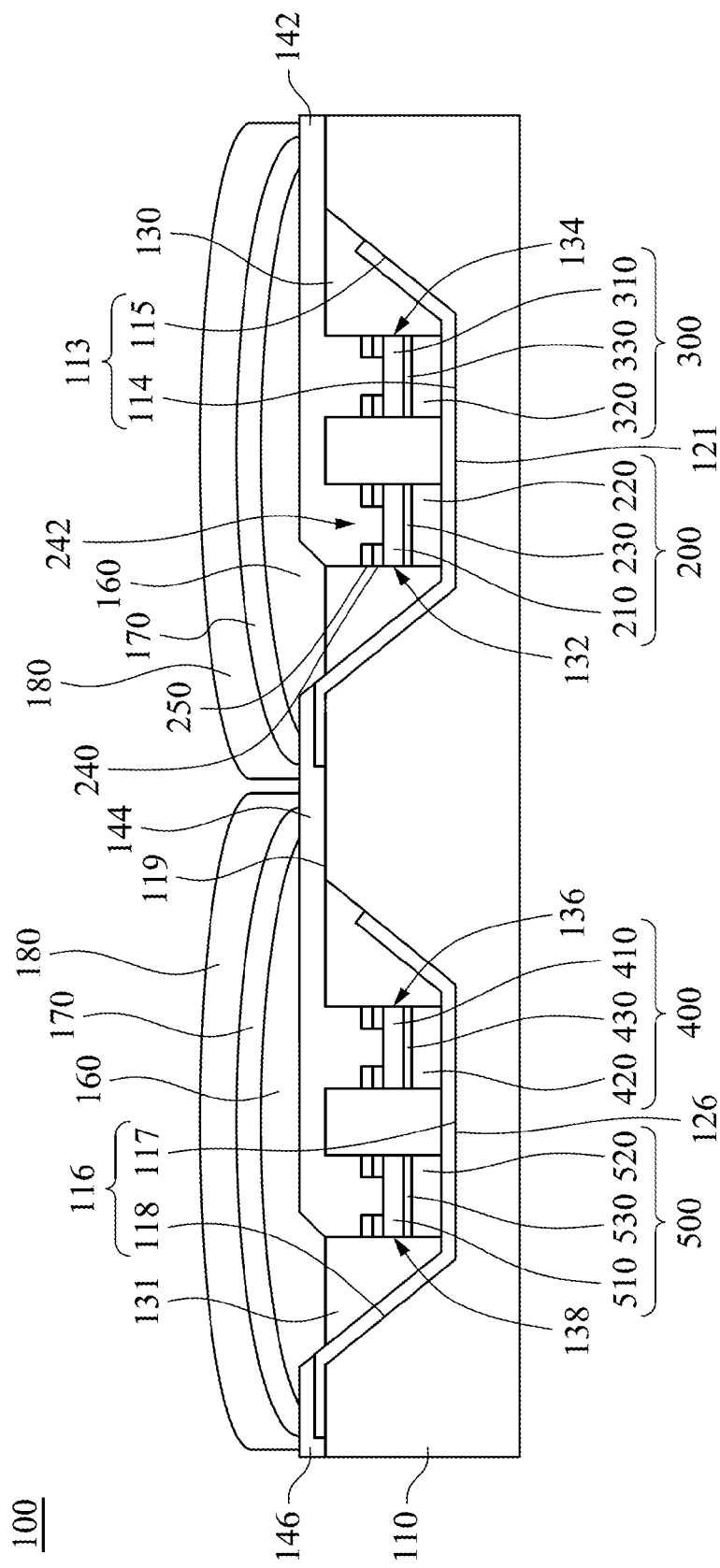
FIG. 1 is a schematic cross-sectional view of a light-emitting diode (LED) lighting device according to one embodiment of this disclosure.

FIG. 1 is a schematic cross-sectional view of a light-emitting diode (LED) lighting device 100 according to one embodiment of this disclosure. As shown in FIG. 1, an LED lighting device 100 is provided. The LED lighting device 100 includes a substrate 110, bottom electrodes 121 and 126, bottom transparent isolation layers 130 and 131, at least one vertical LED 200, at least one vertical LED 400, and a top transparent electrode 144. The substrate 110 has at least one recess 113 and at least one recess 116 therein. The recess 113 has a bottom surface 114 and at least one tapered side surface 115 adjacent to the bottom surface 114, and the recess 116 has a bottom surface 117 and at least one tapered side surface 118 adjacent to the bottom surface 117. The bottom electrode 121 is disposed in the recess 113, and the bottom electrode 121 is reflective and covers at least a part of the bottom surface 114 and at least a part of the tapered side surface 115. The bottom electrode 126 is disposed in the recess 116, and the bottom electrode 126 is reflective and covers at least a part of the bottom surface 117 and at least a part of the tapered side surface 118. The vertical LED 200 is disposed in the recess 113 and on the bottom electrode 121. The vertical LED 400 is disposed in the recess 116 and on the bottom electrode 126. The bottom transparent isolation layer 130 is disposed in the recess 113 and has at least one opening 132 therein to expose at least a part of the vertical LED 200. The bottom transparent isolation layer 131 is disposed in the recess 116 and has at least one opening 136 therein to expose at least a part of the vertical LED 400. The top transparent electrode 144 electrically connects the vertical LED 400 and the bottom electrode 121, such that the vertical LEDs 200 and 400 are electrically connected in series.

By electrically connecting the vertical LEDs 200 and 400 in series, the LED lighting device 100 can achieve high power and high luminous efficiency. In addition, the current passing through the vertical LEDs 200 and 400 can remain small to enhance the lifetime of the vertical LEDs 200 and 400 and reduce heat generated by the vertical LEDs 200 and 400.

Specifically, for example, if the voltage difference of each of the vertical LEDs 200 and 400 is 3.125 volts, and the current passing through the vertical LEDs 200 and 400 is 1 ampere, the power of the combination of the vertical LEDs 200 and 400 is 6.25 watts. If a single LED is used to achieve the same power, the current should be 2 amperes. As a result, the single LED may have a shorter lifetime due to the larger passing current, and the cooling of the single LED may also be more difficult.

Because the LED lighting device 100 employs the top transparent electrode 144 as its top electrode to interconnect different electronic components, a wire bonding process may not be needed. Therefore, the process yield of the LED lighting device 100 is improved, and the manufacturing cost of the LED lighting device 100 is lowered.

The substrate 110 has a high thermal conductivity. Specifically, the substrate 110 is made of silicon, such as undoped silicon, p-type silicon, or n-type silicon, or a ceramic material.

When the substrate 110 is made of silicon, the potential of the substrate 110 may be operated to be the lowest among all elements of the LED lighting device 100, such that the contact surface of the substrate 110 and the conductive elements above the substrate 110 (for example, the bottom electrode 121 or the top transparent electrodes 144) totally or partially form a reverse bias of the p-n junction. Therefore, the substrate 110 is electrically insulated from the conductive elements above the substrate 110.

Figure 2:
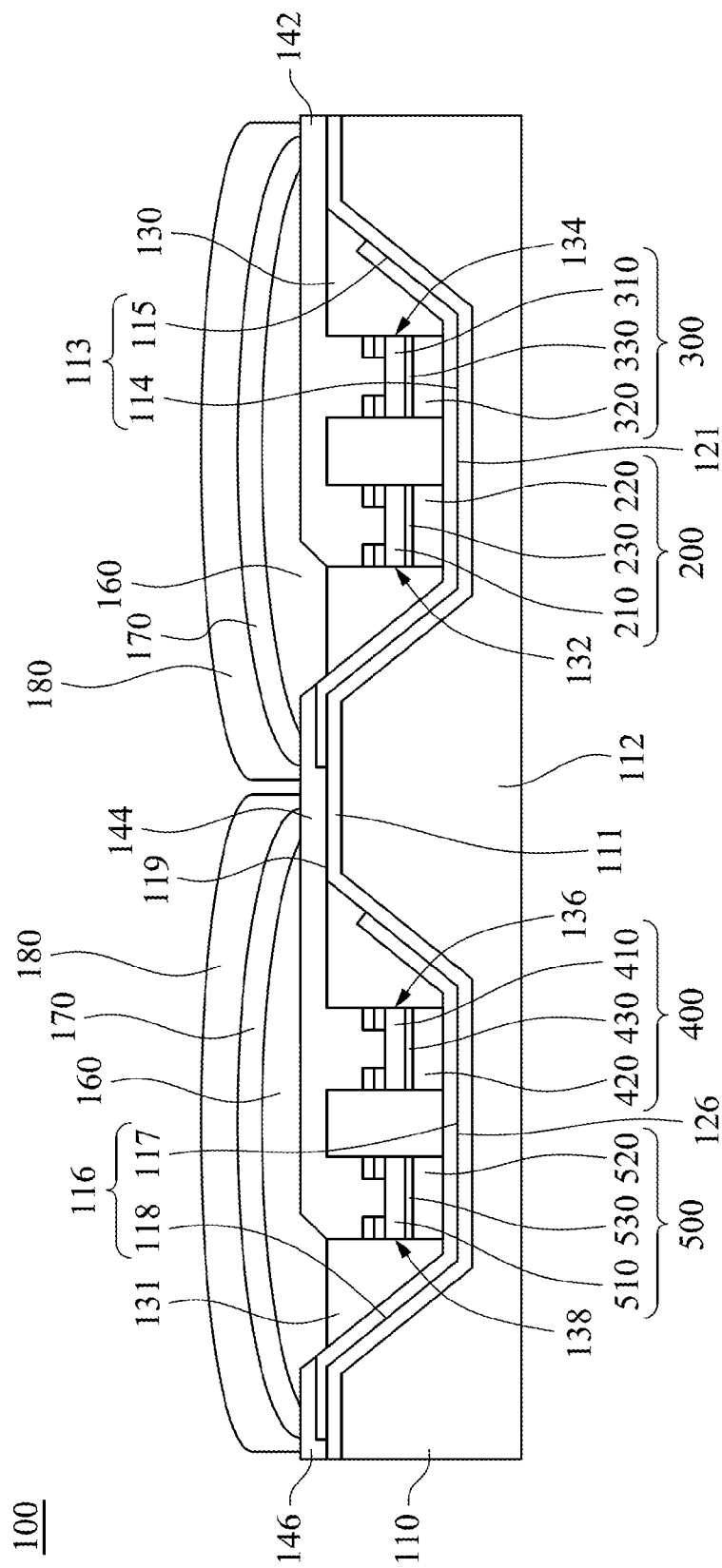
FIG. 2 is a schematic cross-sectional view of the LED lighting device according to another embodiment of this disclosure.

Embodiments of this disclosure are not limited thereto. FIG. 2 is a schematic cross-sectional view of the LED lighting device 100 according to another embodiment of this disclosure. As shown in FIG. 2, the substrate 110 includes an insulation layer 111 and a conductive layer 112. The insulation layer 111 may be made of silicon dioxide (SiO2), which may be oxidized from silicon. The conductive layer 112 may be made of metal such as aluminium, and the conductive layer 112 may function as a heat-dissipating layer.

The potential of the substrate 110 may be operated to be the intermediate value of the maximum potential and the minimum potential among all elements of the LED lighting device 100, such that the potential differences between the substrate 110 and the conductive elements above the substrate 110 (for example, the bottom electrode 121 or the top transparent electrodes 142) are not too large. Therefore, the current does not pass through the insulation layer 111, and thus the substrate 110 is electrically insulated from the conductive elements above the substrate 110.

The depth of the recess 113 is in a range from about 5 μm to about 50 μm. People having ordinary skill in the art can make proper modifications to the depth of the recess 113 depending on the actual application.

The angle between the bottom surface 114 and the tapered side surface 115 is in a range from about 120° to about 160°, and the angle between the bottom surface 117 and the tapered side surface 118 is in a range from about 120° to about 160° as well. If the substrate 110 is made of silicon, and the recess 113 is formed by a wet etching process, the angle between the bottom surface 114 and the tapered side surface 115 is about 125.3°.

The bottom electrodes 121 and 126 are made of metal, such as silver. Embodiments of this disclosure are not limited thereto. In other embodiments, the bottom electrodes 121 and 126 are multi-layer structures. For example, the bottom electrodes 121 and 126 are double-layer structures made of copper and silver or triple-layer structures made of copper, titanium, and silver.

The bottom electrodes 121 and 126 functions as a reflective layer to reflect light emitted from the vertical LEDs 200 and 400, such that light emitted from the vertical LEDs 200 and 400 forwards upwardly. By the cup-shaped bottom electrodes 121 and 126, light emitted from the vertical LEDs 200 and 400 are ensured to forward upwardly and does not forward in an unwanted direction.

The vertical LEDs 200 and 400 are in the same electricity polarity. Specifically, the vertical LED 400 further includes a first semiconductor layer 410 proximal to the top transparent electrode 144 and a second semiconductor layer 420 proximal to the bottom electrode 126. The vertical LED 200 further includes a first semiconductor layer 210 distal to the bottom electrode 121 and a second semiconductor layer 220 proximal to the bottom electrode 121. The first semiconductor layers 210 and 410 of the vertical LEDs 200 and 400 are of the same type, and the second semiconductor layers 220 and 420 of the vertical LEDs 200 and 400 are of the same type.

More specifically, the first semiconductor layers 210 and 410 of the vertical LEDs 200 and 400 are n-type semiconductor layers, and the second semiconductor layers 220 and 420 of the vertical LEDs 200 and 400 are p-type semiconductor layers. Embodiments of this disclosure are not limited thereto. In other embodiments, the first semiconductor layers 210 and 410 of the vertical LEDs 200 and 400 are p-type semiconductor layers, and the second semiconductor layers 220 and 420 of the vertical LEDs 200 and 400 are n-type semiconductor layers.

The first semiconductor layers 210 and 410 and the second semiconductor layers 220 and 420 can be made of gallium nitride (GaN). People having ordinary skill in the art can make proper modifications to the material of the first semiconductor layers 210 and 410 and the second semiconductor layers 220 and 420 depending on the actual application.

The vertical LED 200 further includes an active layer 230 disposed between the first semiconductor layer 210 and the second semiconductor layer 220. The vertical LED 400 further includes an active layer 430 disposed between the first semiconductor layer 410 and the second semiconductor layer 420. Specifically, the active layer 230 and 430 can be multiple-quantum-well structures.

The bottom transparent isolation layers 130 and 131 have a high refractive index. Specifically, the refractive index of the bottom transparent isolation layers 130 and 131 is greater than 1.5. The bottom transparent isolation layers 130 and 131 may reduce total reflection in the vertical LEDs 200 and 400 and thus enhance the light extraction of the vertical LEDs 200 and 400.

The top transparent electrode 144 is made of indium tin oxide (ITO). People having ordinary skill in the art can make proper modifications to the material of the top transparent electrode 144 depending on the actual application.

The LED lighting device 100 further includes at least one vertical LED 300, at least one vertical LED 500, and a top transparent electrode 142. The vertical LED 300 is disposed in the recess 113 and on the bottom electrode 121. The vertical LED 500 is disposed in the recess 116 and on the bottom electrode 126. The bottom transparent isolation layer 130 has an opening 134 therein to expose at least a part of the vertical LED 300. The bottom transparent isolation layer 131 has an opening 138 therein to expose at least a part of the vertical LED 500. The top transparent electrode 144 is further electrically connected to the vertical LED 500 through the opening 138, and the top transparent electrode 142 is electrically connected to the vertical LEDs 200 and 300 through the openings 132 and 134. The bottom electrodes 121 and the top transparent electrodes 142 cooperate to electrically connect the vertical LEDs 200 and 300 in parallel. The bottom electrodes 126 and the top transparent electrodes 144 cooperate to electrically connect the vertical LEDs 400 and 500 in parallel.

The vertical LEDs 200, 300, 400, and 500 are in the same electricity polarity. Specifically, the vertical LED 300 includes a first semiconductor layer 310 proximal to the top transparent electrode 142 and a second semiconductor layer 320 proximal to the bottom electrode 121, and the vertical LED 500 includes a first semiconductor layer 510 proximal to the top transparent electrode 144 and a second semiconductor layer 520 proximal to the bottom electrode 126. The first semiconductor layers 210, 310, 410, and 510 of the vertical LEDs 200, 300, 400, and 500 are of the same type, and the second semiconductor layers 220, 320, 420, and 520 of the vertical LEDs 200, 300, 400, and 500 are of the same type.

Figure 3A:
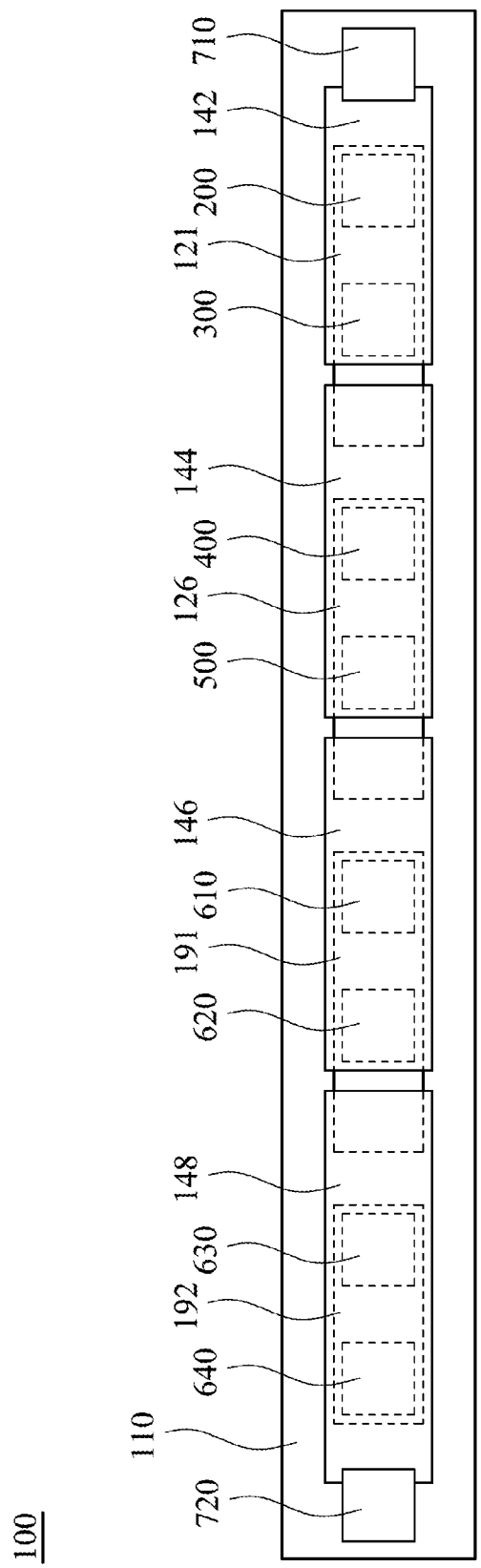
FIG. 3A is a schematic top view of the LED lighting device according to one embodiment of this disclosure.

Similarly, the substrate 110 may further have additional recesses, and the LED lighting device 100 may further includes additional bottom electrodes, top transparent electrodes, and vertical LEDs. FIG. 3A is a schematic top view of the LED lighting device 100 according to one embodiment of this disclosure. For example, as shown in FIG. 3A, the LED light device 100 further includes bottom electrodes 191 and 192, top transparent electrodes 146 and 148, and vertical LEDs 610, 620, 630, and 640. The vertical LEDs 200 and 300, 400 and 500, 610 and 620, and 630 and 640 are electrically connected to each other via the bottom electrodes 121, 126, 191, and 192 and the top transparent electrodes 142, 144, 146 and 148. The vertical LEDs 610 and 620 are electrically connected in parallel via the bottom electrode 191 and the top transparent electrode 146. The vertical LEDs 630 and 640 are electrically connected in parallel via the bottom electrode 192 and the top transparent electrode 148.

The LED lighting device 100 further includes an input electrode 710 and an output electrode 720 respectively electrically connected to the top transparent electrodes 142 and 148 for allowing a power supply to be electrically connected thereto. The input electrode 710 and the output electrode 720 are single-layer structures or multi-layer structures, and the input electrode 710 and the output electrode 720 are made of conductive materials. For example, the input electrode 710 and the output electrode 720 are single-layer structures made of silver, double-layer structures made of copper and silver, or triple-layer structures made of copper, titanium, and silver. In addition, the input electrode 710, the output electrode 720, and the bottom electrodes 121, 126, 191, and 192 may be formed in the same process.

Figure 3B:
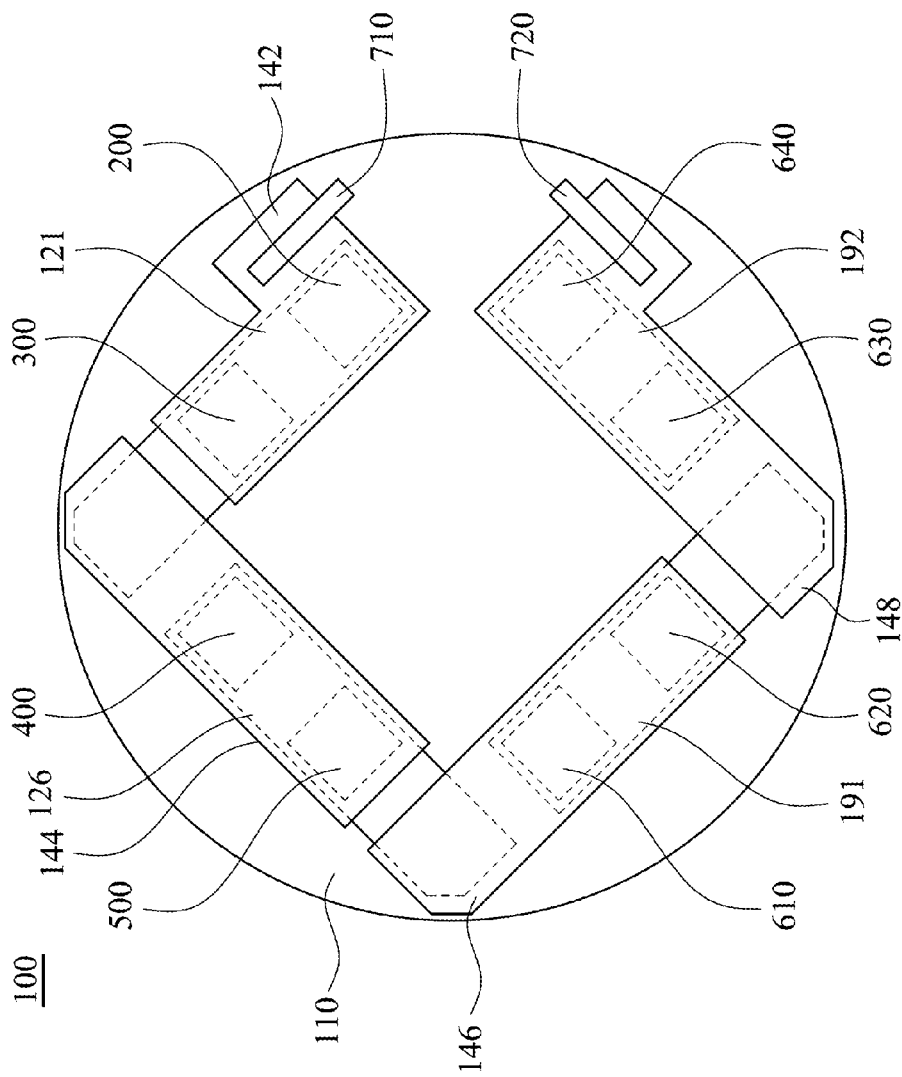
FIG. 3B is a schematic top view of the LED lighting device according to another embodiment of this disclosure.

Specifically, the shape of the substrate 110 is a cuboid, and the bottom electrodes, top transparent electrodes, and vertical LEDs are disposed in a line. Embodiments of this disclosure are not limited thereto. The shape of the substrate 110 may be a cylindrical column, a triangular prism, a cube, a cuboid, a hexagonal column, an octagonal column, or a polygon column. FIG. 3B is a schematic top view of the LED lighting device 100 according to another embodiment of this disclosure. For example, as shown in FIG. 3B, the shape of the substrate 110 is a cylindrical column, and the bottom electrodes, top transparent electrodes, and vertical LEDs are disposed in a ring.

Similarly, the shape of the substrate 110 may be a cylindrical column, a triangular prism, a cube, a cuboid, a hexagonal column, an octagonal column, or a polygon column. The shape of the bottom electrode 122, 124, 126, 191, and 192 may be a cylindrical column, a cube, a cuboid, a dumbbell-shaped column, or a polygon column. The shape of the LEDs 200, 300, 400, 500, 610, 620, 630, and 640 may be a cylindrical column, a cube, a cuboid, a hexagonal column, an octagonal column, or a polygon column. The shape of the top transparent electrodes 142, 144, 146, and 148 may be a cylindrical column, a cube, a cuboid, a hexagonal column, an octagonal column, or a polygon column. The shape of the input electrode 710 and the output electrode 720 may be a cylindrical column, a cube, a cuboid, a hexagonal column, an octagonal column, or a polygon column.

As shown in FIG. 1, the first vertical LED 200 further includes a patterned dielectric layer 240. The patterned dielectric layer 240 is disposed between the first semiconductor layer 210 and the top transparent electrode 142. The patterned dielectric layer 240 covers an edge portion of the first semiconductor layer 210 and has an opening 242. The top transparent electrode 142 is electrically connected to the vertical LED 200 through the opening 242. The function of the patterned dielectric layer 240 is to prevent the surface recombination of the vertical LED 200 and to prevent the leakage of the current through the side surface of the vertical LED 200, thereby enhancing the luminous efficiency of the vertical LED 200.

Specifically, the material of the patterned dielectric layer 240 is silicon nitride or silicon dioxide. The patterning of the patterned dielectric layer 240 is performed by developing and etching process or screen printing and etching process.

The vertical LED 200 further includes a guard ring 250 disposed on the patterned dielectric layer 240. The function of the guard ring 250 is to prevent electrostatic discharge (ESD) and to make the current in the top transparent electrode 142 spread and evenly enter the vertical LED 200.

Specifically, the guard ring 250 is made of metal, such as silver. The patterning of the guard ring 250 is performed by developing and etching process or screen printing and etching process. If the shapes of the horizontal cross-sections of the patterned dielectric layer 240 and the guard ring 250 are the same, the patterning of the guard ring 250 may be used as the mask of the patterned dielectric layer 240.

FIGS. 4A to 4C are horizontal cross-sectional views of the patterned dielectric layer 240 according to different embodiments of this disclosure. As shown in FIGS. 4A to 4C, the shape of the horizontal cross-section of the patterned dielectric layer 240 may be a ring, a ring with a cross, or a plurality of rings with a cross. The shape of the horizontal cross-section of guard ring 250 may be similar to the shape of the horizontal cross-section of the patterned dielectric layer 240. Specifically, the shape of the horizontal cross-section of guard ring 250 may be a ring, a ring with a cross, or a plurality of rings with a cross.

As shown in FIG. 1, other vertical LEDs such as vertical LED 300, 400, or 500 may have patterned dielectric layer and the guard ring similar to the vertical LED 200 as well.

Specifically, the top transparent electrodes 142 and 144 may be patterned from a transparent conductive layer. The patterning of top transparent electrodes 142 and 144 is performed by developing and etching process or screen printing and etching process.

The substrate 110 further has a top surface 119 between the recess 113 and the recess 116, and a part of the bottom electrode 121 is disposed on the top surface 119. The bottom transparent isolation layer 130 covers the bottom electrode 121 and exposes the part of the bottom electrode 121 disposed on the top surface 119. Therefore, the top transparent electrode 144 and the bottom electrode 121 make an electrical contact with each other on the top surface 119, such that the part of the bottom electrode 121 disposed on the top surface 191 functions as an auxiliary electrode of the top transparent electrode 144, and the bottom electrode 121 is electrically isolated from the top transparent electrode 142 by the bottom transparent isolation layer 130. The function of the auxiliary electrode is to enhance the conductivity of the top transparent electrode 144.

The LED lighting device 100 further includes at least one top transparent isolation layer 160 covering at least one of the recesses 113 and 116 and at least one of the vertical LEDs 200, 300, 400, and 500. The top transparent isolation layer 160 has a high refractive index. Specifically, the refractive index of the top transparent isolation layer 160 is greater than 1.5. The refractive index of the bottom transparent isolation layer 130 and 131 is greater than or equal to the refractive index of top transparent isolation layer 160. The top transparent isolation layer 160 may reduce total reflection in the LED light device 100 and thus enhance the light extraction of the vertical LEDs 200, 300, 400, and 500.

Specifically, a part of the top transparent isolation layer 160 covers the recess 113 and the vertical LED 200 and 300, and another part of top transparent isolation layer 160 covers the recess 116 and the vertical LEDs 400 and 500.

In some embodiments, the number of the top transparent isolation layers 160 is at least two, and the top transparent isolation layers 160 are stacked. The refractive indices of the top transparent isolation layers 160 increase toward the vertical LEDs 200 and 300 or the vertical LEDs 400 and 500, and the number of the top transparent isolation layers 160 is up to 5.

The material of the top transparent isolation layer 160 may be the same as the material of the bottom transparent isolation layer 130. People having ordinary skill in the art can make proper modifications to the material of the top transparent isolation layer 160 depending on the actual application.

The LED lighting device 100 further includes a phosphor layer 170 disposed on the top transparent isolation layer 160 and covering at least one of the recesses 113 and 116 and at least one of the vertical LEDs 200, 300, 400, and 500.

Specifically, a part of the phosphor layer 170 covers the recess 113 and the vertical LEDs 200 and 300, and another part of the phosphor layer 170 covers the recess 116 and the vertical LEDs 400 and 500.

The refractive index of the bottom transparent isolation layer 130 is greater than or equal to the refractive index of the phosphor layer 170, and the refractive index of the top transparent isolation layer 160 is greater than or equal to the refractive index of the phosphor layer 170.

The top transparent isolation layer 160 is shaped to allow optical path lengths from at least one of the vertical LEDs 200, 300, 400, and 500 through different portions of the phosphor layer 170 to be substantially the same. Specifically, the top transparent isolation layer 160 is substantially dome shaped. Therefore, the color of the light passing the phosphor layer 170 is even. The situation that the color of some of the light passing the phosphor layer 170 is yellowish and the color of the other of the light passing the phosphor layer 170 is bluish is avoided.

Figure 5:
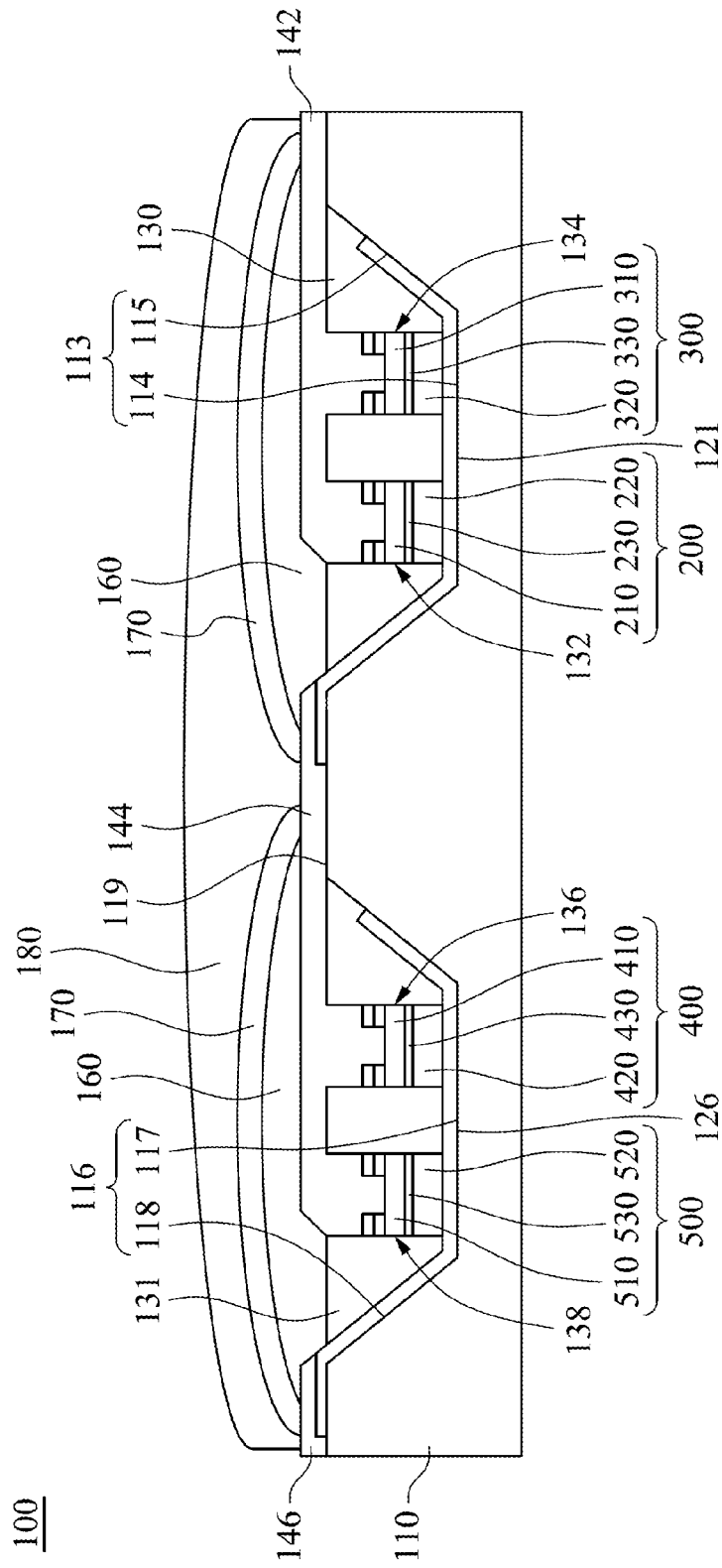
FIG. 5 is a schematic cross-sectional view of the LED lighting device according to another embodiment of this disclosure.

The LED lighting device 100 further includes an encapsulation layer 180 disposed on the phosphor layer 170. The encapsulation layer 180 covers at least one of the recesses 113 and 116 and at least one of the vertical LEDs 200, 300, 400, and 500. Specifically, a part of the encapsulation layer 180 covers the recess 113 and the vertical LEDs 200 and 300, and another part of the encapsulation layer 180 covers the recess 116 and the vertical LEDs 400 and 500. Embodiments of this disclosure are not limited thereto. FIG. 5 is a schematic cross-sectional view of the LED lighting device 100 according to another embodiment of this disclosure. As shown in FIG. 5, the encapsulation layer 180 integrally covers the recesses 113 and 116 and the vertical LEDs 200, 300, 400 and 500.

Figure 6:
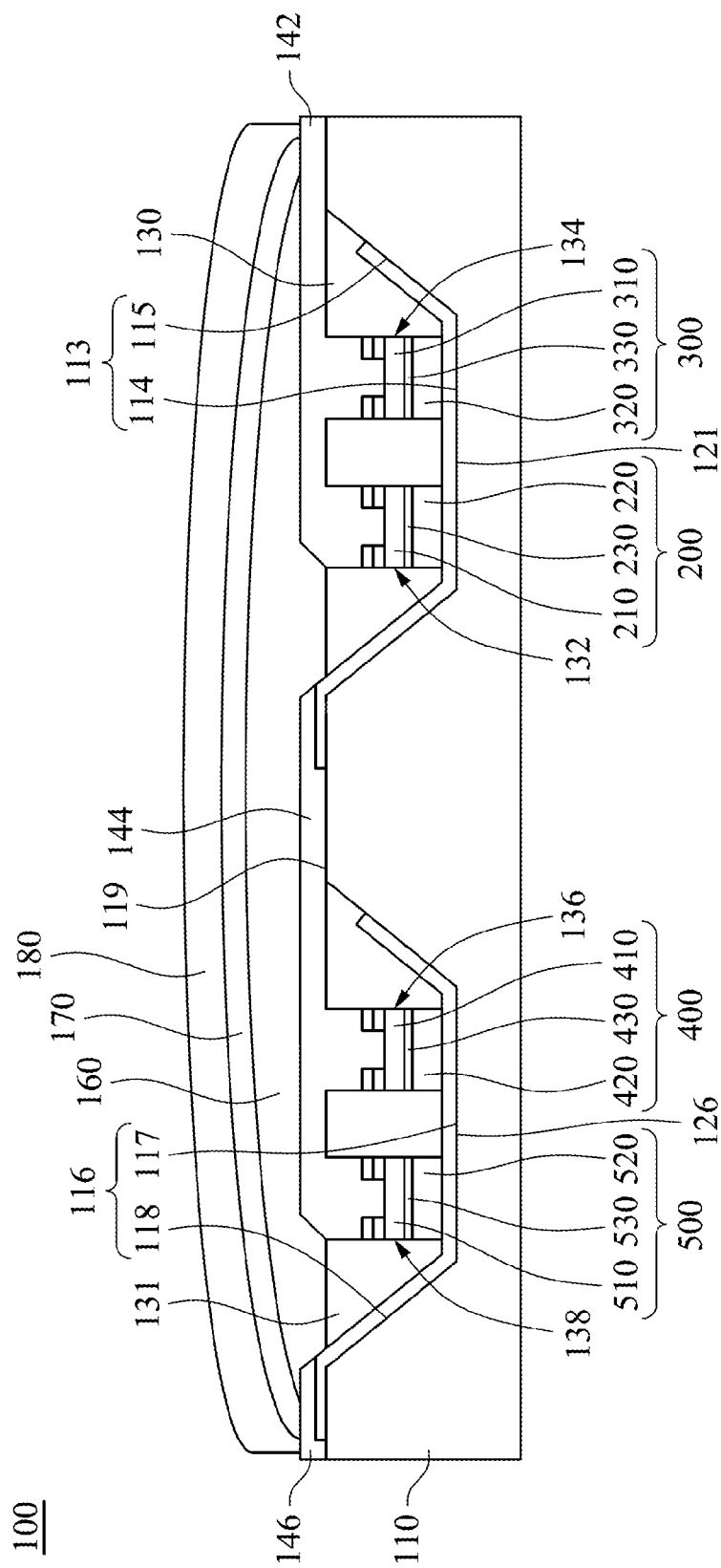
FIG. 6 is a schematic cross-sectional view of the LED lighting device according to another embodiment of this disclosure.

FIG. 6 is a schematic cross-sectional view of the LED lighting device 100 according to another embodiment of this disclosure. As shown in FIG. 6, the top transparent isolation layer 160 integrally covers the recesses 113 and 116 and the vertical LEDs 200, 300, 400 and 500. The phosphor layer 170 integrally covers the recesses 113 and 116 and the vertical LEDs 200, 300, 400 and 500. The encapsulation layer 180 integrally covers the recesses 113 and 116 and the vertical LEDs 200, 300, 400 and 500.

Specifically, the vertical LEDs 200, 300, 400, and 500 have top surfaces, and heights of the top surfaces of the vertical LEDs 200, 300, 400, and 500 are lower than a height of the top surface 119 of the substrate 110. Therefore, lateral light emitted from the vertical LEDs 200, 300, 400, and 500 is reflected by the bottom electrodes 121 and 126, and there are rooms to dispose additional transparent dielectric layers or phosphor layers in the recesses 113 and 116 to adjust optical paths, such that light efficiency of the LED lighting device 100 is optimized.

As shown in FIG. 1, the number of the vertical LEDs in the recess 113 and the number of the vertical LEDs in the recess 116 are the same. Embodiments of this disclosure are not limited thereto. In some embodiment, the number of the vertical LEDs in the recess 113 and the number of the vertical LEDs in the recess 116 are different. For example, in some embodiments, the LED lighting device 100 does not include the vertical LED 300. In some embodiments, the LED lighting device 100 further includes at least one additional vertical LED in the recess 113.

Figure 7:
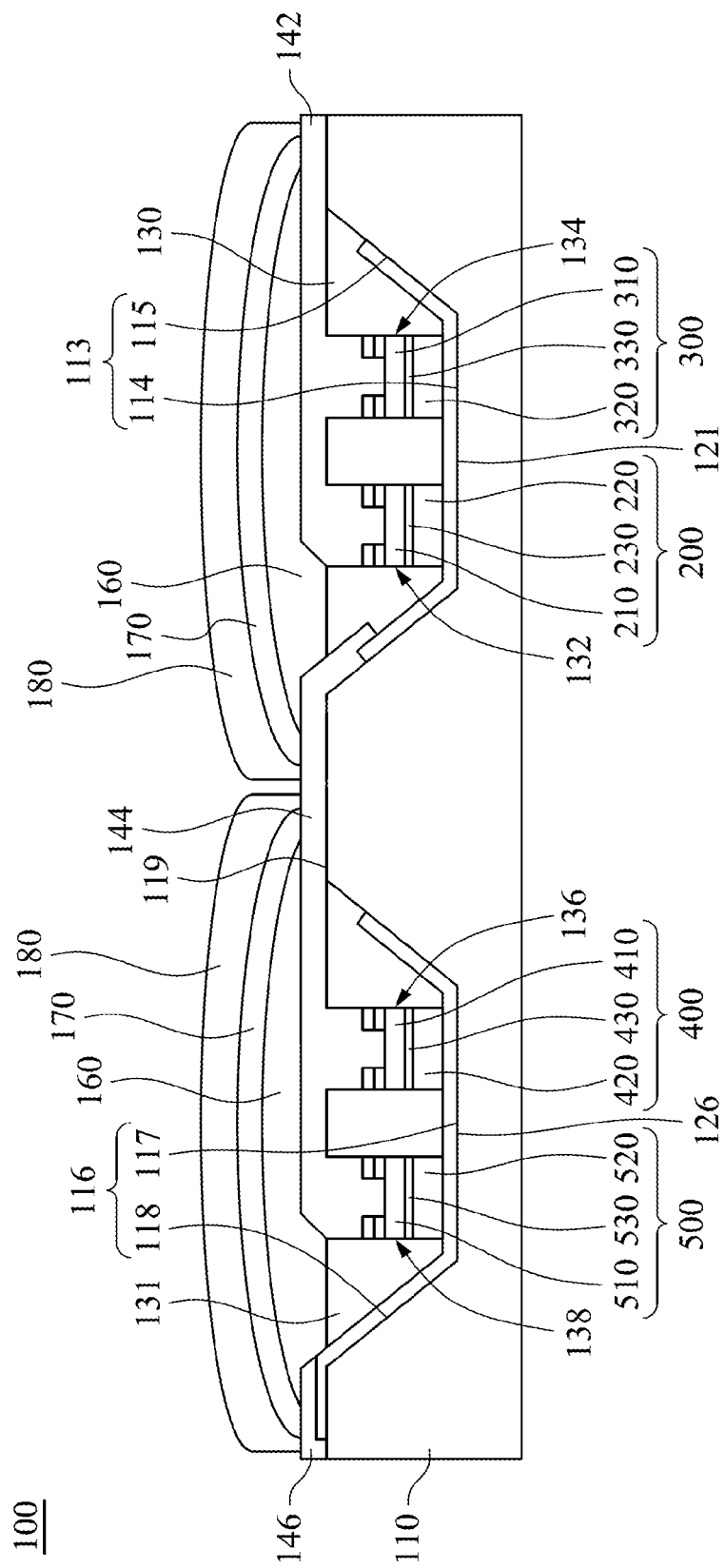
FIG. 7 is a schematic cross-sectional view of the LED lighting device according to another embodiment of this disclosure.

FIG. 7 is a schematic cross-sectional view of the LED lighting device 100 according to another embodiment of this disclosure. In the embodiment, the bottom electrode 121 is not disposed on the top surface 119, and a part of the top transparent electrode 144 is disposed on the tapered side surface 115. The top transparent electrode 144 and the bottom electrode 121 make an electrical contact with each other on the tapered side surface 115.

As shown in FIGS. 1, 2, 5, 6, and 7, the LED lighting device 100 includes only one substrate, i.e., the substrate 110, and all other structures are stacked on the substrate 110. Therefore, the manufacturing processes of the LED lighting device 100 become easy, and problems such as alignment difficulty are avoided, such that the process yield is enhanced and the production cost is lowered.

By electrically connecting the vertical LEDs in series, the LED lighting device 100 can achieve high power and high luminous efficiency by electrically connecting to a power supply with high voltage. In addition, the current passing the vertical LEDs needs not to be large to achieve high power and high luminous efficiency. Therefore, the lifetime of the vertical LEDs may be longer, and cooling may not become a problem.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A light-emitting diode (LED) lighting device, comprising:
   a substrate having at least one first recess and at least one second recess therein, wherein at least one of the first recess and the second recess has a bottom surface and at least one tapered side surface adjacent to the bottom surface, and the substrate has a top surface;
   a first bottom electrode disposed in the first recess;
   a second bottom electrode disposed in the second recess, wherein at least one of the first bottom electrode and the second bottom electrode is reflective and covers at least a part of the bottom surface and at least a part of the tapered side surface;
   at least one first vertical LED disposed in the first recess and on the first bottom electrode, wherein the first vertical LED has a top surface, and a height of the top surface of the first vertical LED is lower than a height of the top surface of the substrate;
   at least one second vertical LED disposed in the second recess and on the second bottom electrode;
   a first bottom transparent isolation layer disposed in the first recess, wherein the first bottom transparent isolation layer has at least one opening therein to expose at least a part of the first vertical LED;
   a second bottom transparent isolation layer disposed in the second recess, wherein the second bottom transparent isolation layer has at least one opening therein to expose at least a part of the second vertical LED; and
   a top transparent electrode electrically connecting the first vertical LED and the second bottom electrode, wherein a height of a surface of the top transparent electrode containing the top surface of the first vertical LED is lower than a height of a surface of the top transparent electrode contacting the second bottom electrode.

2. The LED lighting device of claim 1, wherein the first vertical LED comprises:
   a first semiconductor layer proximal to the top transparent electrode; and
   a second semiconductor layer proximal to the first bottom electrode; and
   the second vertical LED comprises:
   a first semiconductor layer distal to the second bottom electrode; and
   a second semiconductor layer proximal to the second bottom electrode, wherein the first semiconductor layers of the first vertical LED and the second vertical LED are of the same type, and the second semiconductor layers of the first vertical LED and the second vertical LED are of the same type.

3. The LED lighting device of claim 1, wherein at least one of the first bottom electrode and the second bottom electrode is made of metal.

4. The LED lighting device of claim 1, wherein at least one of the first bottom electrode and the second bottom electrode is a multi-layer structure.

5. The LED lighting device of claim 1, wherein a plurality of the first vertical LEDs disposed in the first recess and on the first bottom electrode, and the top transparent electrode and the first bottom electrode cooperate to electrically connect the first vertical LEDs in parallel.

6. The LED lighting device of claim 5, wherein each of the first vertical LEDs comprises:
   a first semiconductor layer proximal to the top transparent electrode; and
   a second semiconductor layer proximal to the first bottom electrode, wherein the first semiconductor layers of the first vertical LEDs are of the same type, and the second semiconductor layers of the first vertical LEDs are of the same type.

7. The LED lighting device of claim 1, wherein the substrate has a top surface between the first recess and the second recess, and the top transparent electrode and the second bottom electrode make an electrical contact with each other on the top surface, such that the part of the second bottom electrode disposed on the top surface functions as an auxiliary electrode of the top transparent electrode.

8. The LED lighting device of claim 1, wherein the first vertical LED comprises:
   a first semiconductor layer proximal to the top transparent electrode;
   a second semiconductor layer proximal to the first bottom electrode;
   an active layer disposed between the first semiconductor layer and the second semiconductor layer; and
   a patterned dielectric layer disposed between the first semiconductor layer and the top transparent electrode and covering an edge portion of the first semiconductor layer.

9. The LED lighting device of claim 8, wherein the first vertical LED further comprises:
   a guard ring disposed on the patterned dielectric layer.

10. The LED lighting device of claim 1, further comprising:
    at least one top transparent isolation layer covering at least one of the first vertical LED and the second vertical LED.

11. The LED lighting device of claim 10, wherein the refractive index of the first bottom transparent isolation layer is greater than or equal to the refractive index of the top transparent isolation layer.

12. The LED lighting device of claim 10, wherein the refractive indices of a plurality of the top transparent isolation layers increase towards the first vertical LED and the second vertical LED.

13. The LED lighting device of claim 1, further comprising:
    a phosphor layer covering at least one of the first vertical LED and the second vertical LED.

14. The LED lighting device of claim 13, wherein the phosphor layer at least covers the first recess.

15. The LED lighting device of claim 13, wherein the refractive index of the first bottom transparent isolation layer is greater than or equal to the refractive index of the phosphor layer.

16. The LED lighting device of claim 13, wherein optical path lengths from at least one of the first vertical LED and the second vertical LED through different portions of the phosphor layer are substantially the same.

17. The LED lighting device of claim 13, further comprising:
    at least one top transparent isolation layer disposed between the phosphor layer and the first bottom transparent isolation layer, wherein the top transparent isolation layer is shaped to allow optical path lengths from at least one of the first vertical LED and the second vertical LED through different portions of the phosphor layer to be substantially the same.

18. The LED lighting device of claim 17, wherein the refractive index of the top transparent isolation layer is greater than or equal to the refractive index of the phosphor layer.

19. The LED lighting device of claim 17, further comprising:
- an encapsulation layer disposed on the phosphor layer, wherein the encapsulation layer covers at least one of the first recess and the second recess.

20. The LED lighting device of claim 13, further comprising:
- an encapsulation layer disposed on the phosphor layer, wherein the encapsulation layer covers at least one of the first recess and the second recess.

21. The LED lighting device of claim 1, further comprising:
- an encapsulation layer covering at least one of the first recess and the second recess.

22. The LED lighting device of claim 1, wherein the number of the first vertical LED in the first recess and the number of the second vertical LED in the second recess are the same.

23. The LED lighting device of claim 1, wherein the number of the first vertical LED in the first recess and the number of the second vertical LED in the second recess are different.

* * * * *